United States Patent [19]

Schoenthaler et al.

[11] Patent Number: 4,597,420

[45] Date of Patent: Jul. 1, 1986

[54] TECHNIQUES FOR MULTIPOINT DISPENSING OF VISCOUS MATERIAL

[75] Inventors: David Schoenthaler, Lower Makefield Township, Bucks County, Pa.; Thaddeus Wojcik, Hopewell Township, Mercer County, N.J.

[73] Assignee: AT&T Technologies, Inc., Berkeley Heights, N.J.

[21] Appl. No.: 699,210

[22] Filed: Feb. 7, 1985

Related U.S. Application Data

[62] Division of Ser. No. 498,350, May 26, 1983, Pat. No. 4,515,297.

[51] Int. Cl.[4] .................. B65B 1/08; B65B 31/00
[52] U.S. Cl. ........................................ 141/2; 141/8; 141/11; 141/12; 141/82; 141/72; 141/73
[58] Field of Search ............... 141/1, 2, 4–8, 141/9–12, 18, 21, 59–61, 37, 39, 44, 47, 54, 57, 69, 71, 72–82, 98

[56] References Cited

U.S. PATENT DOCUMENTS

| 2,381,454 | 8/1945 | Huth | 141/59 |
|---|---|---|---|
| 2,613,864 | 10/1952 | Carter | 141/59 X |
| 2,690,865 | 10/1954 | Fischer et al. | 141/59 X |
| 2,780,247 | 2/1957 | Claassen, Jr. | 141/7 |
| 2,794,417 | 6/1957 | Starkey et al. | 118/51 |
| 2,815,621 | 10/1957 | Carter | 141/7 X |
| 2,933,785 | 4/1960 | Hansberg | 141/59 |
| 3,059,610 | 10/1962 | Mintz | 118/7 |
| 3,077,857 | 2/1963 | Widner | 118/2 |
| 3,421,554 | 1/1969 | Carter | 141/7 |
| 3,570,721 | 3/1971 | Cushman | 222/319 |
| 3,838,316 | 10/1974 | Ripple et al. | 141/12 |
| 3,970,222 | 7/1976 | Duffield | 222/148 |
| 4,030,640 | 6/1977 | Citrin et al. | 222/207 |
| 4,154,379 | 5/1979 | Schermutzki | 222/420 |
| 4,156,398 | 5/1979 | McDaniel | 118/2 |
| 4,156,495 | 5/1979 | Weinhold | 222/1 |
| 4,162,034 | 7/1979 | Pavlas | 228/37 |
| 4,295,596 | 10/1981 | Doten et al. | 228/180 |
| 4,332,373 | 6/1982 | Huppunen et al. | 266/228 |
| 4,373,657 | 2/1983 | Fillon | 228/229 |

FOREIGN PATENT DOCUMENTS

| 2710791 | 9/1978 | Fed. Rep. of Germany. |
| 2813817 | 10/1979 | Fed. Rep. of Germany. |
| 8100817 | 4/1981 | World Int. Prop. O.. |
| 2117677 | 10/1983 | United Kingdom. |

OTHER PUBLICATIONS

Article by D. Schoenthaler entitled "Soldering Circuit Assemblies in the 1980's" published in Proceedings of Printed Circuit World Convention II, Munich, West Germany, vol. 1, pp. 131-140, Jun. 9-12, 1981.

Primary Examiner—Stephen Marcus
Assistant Examiner—Ernest G. Cusick
Attorney, Agent, or Firm—D. J. Kirk; M. de Picciotto

[57] ABSTRACT

A multipoint dispensing of viscous material onto a board (23) comprises the monitoring and controlling of several process parameters such as the initial gap (δ) between a dispensing tool (20,25) and the board (23), the dispense pressure time cycle within the tool (FIG. 3A) and the tool velocity cycle (FIG. 3B). Also, an improved method for loading solder paste into the dispensing tool includes applying vacuum to two regions of the tool while vibrating it in its axial direction (FIG. 4). Furthermore, improved techniques for preventing crust formation on the paste within the tool, and for controlling the viscosity of the solder paste within the tool, achieve consistent dispensing results in a production environment.

13 Claims, 8 Drawing Figures

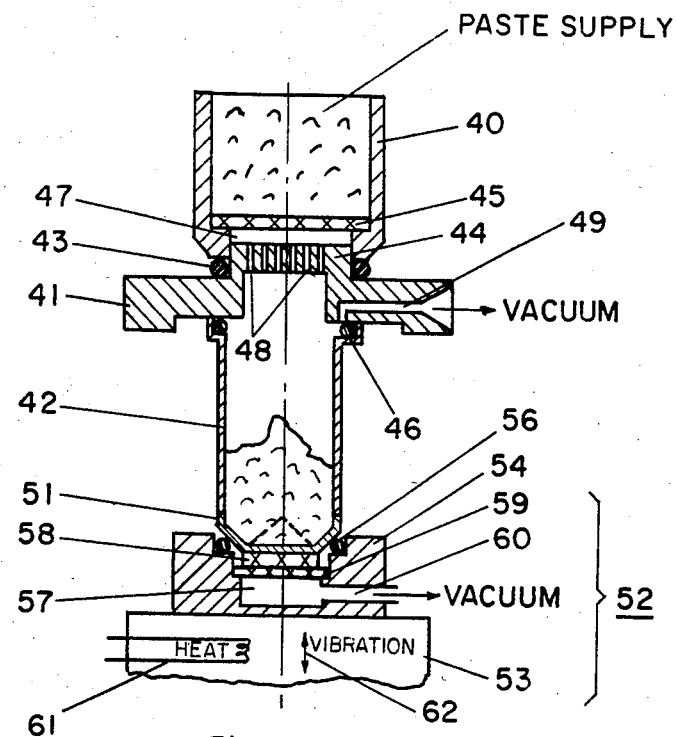
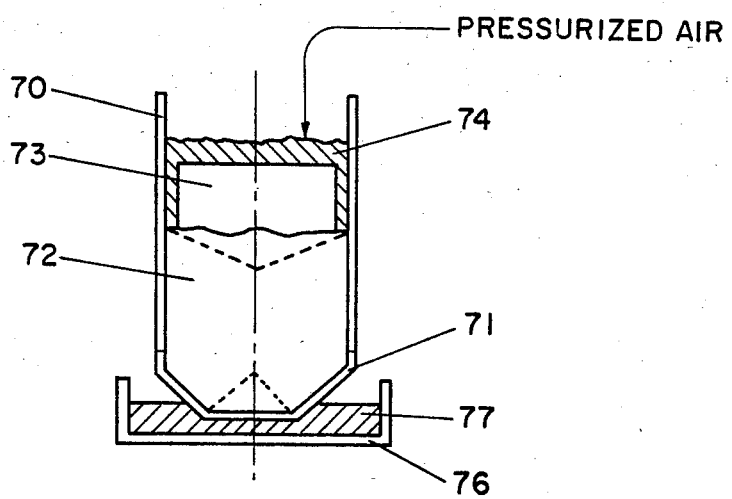

TECHNIQUES FOR MULTIPOINT DISPENSING OF VISCOUS MATERIAL

This is a division of application Ser. No. 498,350 filed May 26, 1983, now U.S. Pat. No. 4,515,297.

TECHNICAL FIELD

The present invention is directed to a technique for multipoint dispensing of viscous materials and more particularly, to a method and an apparatus for multipoint dispensing of solder paste for surface mounting of chip carriers on circuit boards.

BACKGROUND OF THE INVENTION

Over the past few years, the complexity and capabilities of integrated circuits (IC's) have grown while their dimensions continued to shrink. The rapid advances in semiconductor technology nearly doubles the number of circuit functions per semiconductor chip per year. In order to keep pace with the very large scale integration technology, the semiconductor chips require higher pin out packages having small sizes thereby achieving optimal electronic performance and increased circuit board densities. Because of the foregoing, the well known dual in-line packages (DIP's) are gradually being replaced by surface-mounted chip carrier packages.

Coincident with the higher packing density of surface-mounted components is the corresponding reduction in solder joint size and spacing on the printing wiring board (PWB), as well as the increase in number of solder joints on each PWB assembly. Several methods of solder deposition are described in a paper by D. Schoenthaler entitled "Soldering Circuit Assemblies in the 1980's" published in Proceedings of Printed Circuit World Convention II, Munich, West Germany, Vol. 1, pages 131-140, June 9-12, 1981. When using screen or stencil printing of solder on a PWB, then volume of solder deposited on the PWB must be sufficient to prevent joint opens due to poor component lead planarity, PWB warpage, inaccurate component placement and misregistration of the solder mask with respect to the bond sites on the PWB. On the other hand, in view of the reduced spacing between neighboring solder joints on the PWB, the quantity of solder deposited should not be excessive to avoid an electrical short between two adjacent solder joints.

As mentioned in the above reference by D. Schoenthaler, an alternative method for depositing solder paste on PWB's is a technique using a multipoint dispensing tool comprising a hollow chamber having a multiorifice nozzle attached at one end thereof. The nozzle orifices are spaced to match the PWB footprint pattern and the corresponding chip carrier lead geometry. Applicants observed that the implementation of multiprint dispensing techniques in a manufacturing environment encountered various problems affecting the reliability and reproducibility of the solder joints. Some of these problems include the poor control of the volume and geometry of the dispensed solder paste, clogging of the orifices of the nozzle, variations in the paste viscosity, and difficulty in achieving uniform paste distribution among the orifices due to paste crust and/or void formations within the dispensing tool.

Therefore, there exists a need for an improved solder paste multipoint dispensing technique capable of being reliably and reproducibly implemented in a semiconductor manufacturing environment.

SUMMARY OF THE INVENTION

In one embodiment of the invention comprises the steps of placing a supply container of solder paste in transfer relationship with the top portion of the dispensing tool; applying vacuum to two regions of the dispensing tool thereby pulling solder paste out of the supply container into the dispensing tool; vibrating the dispensing tool for a first predetermined time period substantially along its axial direction while the vacuum is applied; and removing the vacuum while maintaining the vibration of the dispensing tool for a second predetermined time period.

A further embodiment of the invention relates to a method for handling solder paste within a solder paste dispensing tool which comprises covering the top surface of the paste within the tool with a liquid seal for preventing crust layer formation therein.

In accordance with another embodiment of the invention, a method for handling solder paste within a multiorifice paste dispensing tool comprises placing the orificed portion of the dispensing tool, when not in use, in a container including a liquid seal material for preventing the paste in the orifices from drying.

A still further embodiment of the invention is directed to a method for controlling the viscosity of solder paste within a multiorifice solder dispensing tool comprising the steps of monitoring the temperature within the tool; and circulating a flow of heating fluid proximate to the exterior surface of the dispensing tool in response to the temperature monitoring step.

BRIEF DESCRIPTION OF THE DRAWINGS

FIG. 4 illustrates a solder paste loading technique in accordance with another embodiment of the invention;

FIG. 5 schematically shows a technique for preventing paste crust formation in accordance with a further embodiment of the invention;

DETAILED DESCRIPTION

Although the following description relates to multipoint dispensing of solder paste, it is well within the spirit and scope of the present invention to apply the inventive concepts disclosed herein to dispensing other types of viscous materials. Viscous materials of a type having a dispense viscosity ranging from about $2 \times 10^5$ cps to about $2 \times 10^6$ cps at 1 sec$^{-1}$ shear rate may be dispensed using the teachings described herein. In other words, the various principles to be described hereinafter are readily applicable to materials such as adhesives (e.g., conductive as well as nonconductive epoxies), silicones (e.g., Room Temperature Vulcanizing (RTV) Silicone), rubbers and/or other viscous materials widely used in the electronic industry.

Figure 1:
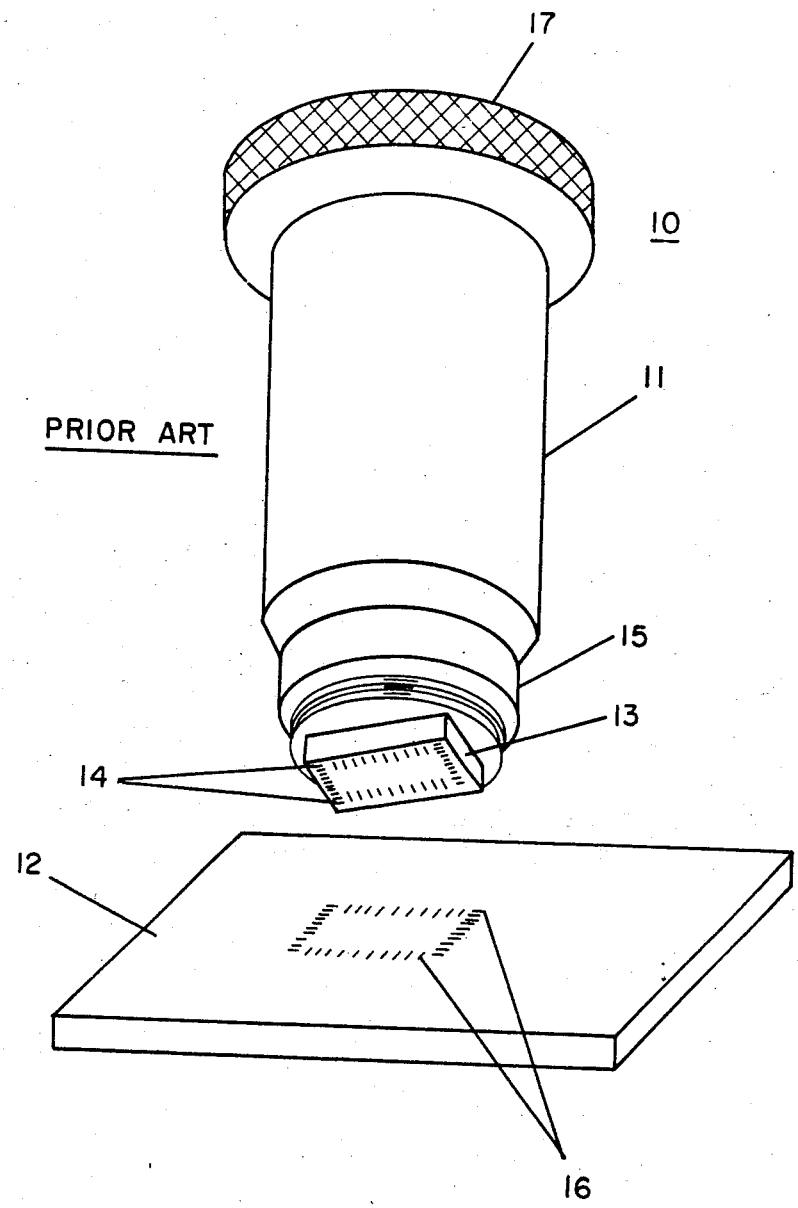
FIG. 1 shows a known multipoint solder paste dispenser.

In FIG. 1, reference numeral 10 indicates a multipoint solder paste dispenser of the type described in the above-referenced paper by D. Schoenthaler (see FIG. 5 thereof). The dispenser 10 comprises a generally cylindrical hollow cartridge 11 adapted to receive solder paste to be dispensed on a printed wiring board (PWB) 12. A nozzle 13 having a plurality of openings 14 is attached at one end 15 of the cartridge 11. As shown in FIG. 1, the openings 14 are located along the periphery of the nozzle 13 and are spaced and shaped to substantially match a pluralilty of bond sites 16 on the PWB 12. At the other end 17 of the cartridge 11, pressurized air is supplied thereto to force solder paste out of the openings 14 of the nozzle 13 onto the bond sites 16 of the PWB 12.

MULTIPOINT DISPENSING PROCESS

Figure 2:
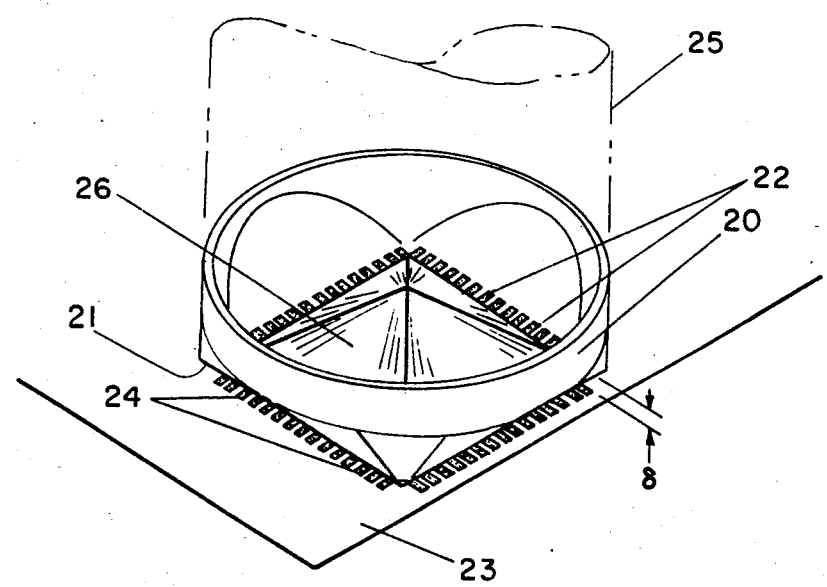
FIG. 2 is a perspective schematic representation of the interior of a multipoint dispensing nozzle in accordance with an embodiment of the invention.

Shown in FIG. 2 is an inside perspective view of a nozzle 20 according to an illustrative embodiment of the invention. The nozzle 20 has a flat bottom face 21 with a plurality of openings 22 arranged in a predetermined pattern. The openings 22 are dimensioned and spaced to substantially correspond to the metallized terminations of a chip carrier (not shown) to be mounted on a board 23. Also shown on the board 23 is a plurality of bond sites 24 having a pattern substantially identical to that of the nozzle openings 22. Alignment of the openings 22 with the bond sites 24 may be achieved by using any well known alignment technique, such as that described in U.S. Pat. No. 4,295,596 assigned to the instant assignee.

The nozzle 20 is adapted to be connected at one end of a cylindrical solder paste cartridge 25 comparable to the cartridge 11 of FIG. 1. The solder paste may be selected from known commercially available types commonly used in the electronics industry. Positioned within the nozzle 20 is a pyramid shaped diverter 26 for directing the paste flow towards the openings 22. The diverter 26 prevents stagnation of the paste in the central portion of the nozzle 20 while, at the same time, reducing the volume of paste needed to fill the nozzle 20 and the cartridge 25.

Figures 3A, 3B:
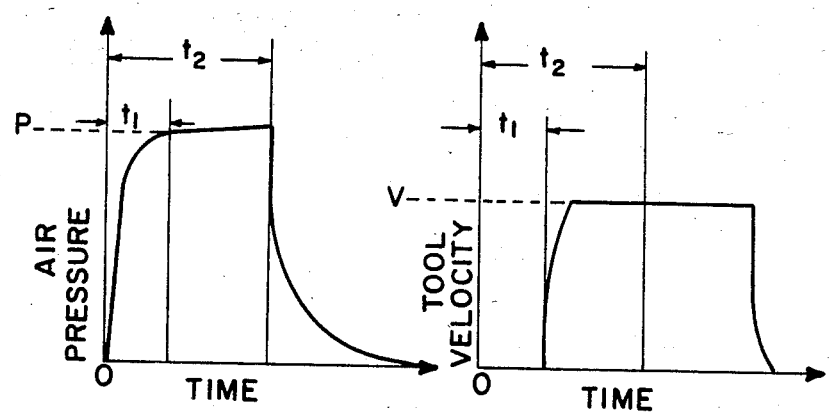
FIGS. 3A and 3B show time diagrams of the dispensing parameters in accordance with one embodiment of the invention.

A solder paste dispensing sequence will be described with reference to FIGS. 2, 3A and 3B. At a first stage of the sequence, the nozzle 20 and the board 23 are moved relative to each other, and are positioned at a predetermined initial distance, $\delta$, from each other. Although the initial distance, $\delta$, is shown in FIG. 2 as being different from zero, the present teachings are also applicable when the surface 21 of the nozzle 20 and the board 23 are initially in contact with each other. During a time interval $t_1$, pressurized air is supplied to the dispensing tool (i.e., to the cartridge 25 and the nozzle 20 attached thereto) forcing paste out of the orifices 22 onto, and in adherence with, the bond sites 24 of the board 23 thus closing the initial gap, if any, between the bottom face 21 of the nozzle 20 and the board 23. At time $T_1$, the dispensing tool (including the nozzle 20 and the cartridge 25) is moved upwards and away from the surface of the board 23 at a predetermined substantially constant velocity, V. Alternatively, if the dispensing tool is fixed, then at time $t_1$ the board 23 is moved downwards and away from the tool at the constant velocity V. While the dispensing tool is moving away from the board 23, the dispense air pressure, P, remains substantially constant and is terminated at time $t_2$. The dispensing nozzle 20 continues to move upwards causing the paste adhering to the board 23 to separate from the nozzle openings 22 thus leaving deposits on the bond sites 24 of board 23.

The foregoing dispensing sequence achieved reliable and reproducible multipoint dispensing of solder paste when predetermined process parameters were accurately monitored. In accordance with an embodiment of the invention, these process parmeters include the inital gap, $\delta$; the dispense pressure P, the tool velocity V and the time periods $t_1$ and $t_2$. In a preferred embodiment of the invention, the initial gap $\delta$ is of the order of 0.0 to 0.010 inch, the higher end of such range allowing for board warpage; the dispense pressure P ranges between 1 and 10 psi; the range of the tool velocity V is between 0.5 and 5 inch/minute; the delay time $t_1$ is of the order of 0.1 to 0.5 sec.; and the dispense time $t_2$ is typically between 0.2 and 1.0 sec. When selecting a short delay time $t_1$ of about 0.1 sec, the preferred corresponding dispense time $t_2$ is selected in a range between 0.2 and 0.4 sec. If the delay time $t_1$ is a longer one, e.g., of the order of 0.5 sec., the preferred dispense time $t_2$ is set between 0.65 and 1.00 sec. One condition to be maintained for the selection of the two time periods $t_1$ and $t_2$ is that the latter is always larger than the former in order to permit the paste to be fed out of the nozzle as the latter retracts.

SOLDER PASTE LOADING

An important aspect of solder paste dispensing is the method used to load solder paste into the dispensing cartridge and nozzle assembly. Poor dispensing usually results from anomalies such as semirigid paste, crust, and/or voids. Large volumes of crust or semirigid paste will clog the small openings of the dispensing nozzle. Moreover, voids near the nozzle orifices tend to cause preferential paste flow around such voids resulting in skips (i.e., no deposit) similar to physically clogged openings.

FIG. 4 schematically illustrates a method and an apparatus for loading paste into the dispenser cartridge and nozzle in accordance with an embodiment of the invention. Solder paste is placed in a supply container 40 where it is warmed by being mixed vigorously without introducing additional air or changing the character of the paste itself. Heat is applied if necessary to elevate the paste temperature to about 100°-120° F. The supply container 40 is coupled to one side of an adaptor plate 41 which in turn is located on top of a dispensing cartridge 42 to be loaded or filled with solder paste.

A first seal 43 is located around a neck portion 44 of the adaptor plate 41 to prevent leaks between the supply container 40 and the adaptor plate 41. A second seal 46 is positioned between the top portion of the dispensing cartridge 42 and the adaptor plate 41. A wire screen 45 is positioned proximate to the bottom of the supply container 40 for filtering semirigid paste and crust particles out of the paste prior to its transfer into the dispensing cartridge 42. A small gap 47, formed between the top of the neck portion 44 of the adaptor plate 41 and the wire screen 45, reduces the amount of paste wasted each time a filled supply container is attached to the plate 41.

The neck portion 44 of the adaptor plate 41 comprises at least one hold 48 for allowing paste to be transferred from the supply container 40 into the dispensing cartridge 42. Preferably, an array of small diameter holes (such as holes 48) is formed in the neck portion 44 of the adaptor plate 41. The latter further comprises an elongated chamber 49 for coupling a vacuum source (not shown) to the top portion of the dispensing cartridge 42.

The bottom portion of the dispensing cartridge 42 comprises a multi-orifice nozzle 51 attached thereto. The nozzle 51 is of a type described above in connection with FIG. 2. The dispensing tool including the cartridge 42 and the nozzle 51 is placed on a loading station 52 which comprises a loading table 53 and a supporting table 54. Body 54 comprises, in a recessed portion thereof, a seal 56 adapted to mate with the periphery of the nozzle 51. Also comprised within a central opening 57 of the body 54 is a filtering arrangement comprising a filter member 58 supported by a porous member 59, such as a metal screen or a rigid plate having a plurality of holes therethrough. The filter member 58 may be, for example, a sheet of filter paper. Preferably, the filter member 58 includes a rough-surfaced rubber pad positioned within the opening 57 of the supporting body 54 such that its top rough surface is in slight contact with the bottom flat face of the nozzle 51. The supporting body 54 further comprises an elongated conduit 60 for coupling a source of vacuum (not shown) to its central opening 57.

In order to load paste into the dispensing cartridge 42, the paste is pulled by vacuum (applied via the chamber 49) through the wire screen 45 and the array of holes 48 from the supply container 40 into the cartridge 42. Also, vacuum is drawn (via conduit 60 and central opening 57) from beneath the nozzle 51 through the filtering arrangement 58, 59. Furthermore, heat is applied to the entire loading apparatus, as schematically illustrated by reference numeral 61 in FIG. 4, such that the paste and all nozzle and cartridge surfaces are maintained within a predetermined range of about 100°-120° F. dependent upon the type of paste used. Heating of the paste enables it to maintain its viscosity in a suitable range resulting in good flow characteristics.

The vacuums applied chamber 49 and conduit 60 are held constant while paste is pulled into the dispensing cartridge 42. When the paste is fully loaded into the cartridge/nozzle assembly, the vacuums are maintained while the loading table 53 is vibrated up and down in the axial direction of the cartridge 42 as illustrated by bidirectional arrow 62. Typically, the table 53 would be vibrating during an initial period of about 20 seconds with vacuums applied. Next, with the vacuums turned off, the vibration of the table 53 is continued for an additional period of about 10 seconds. The use of a rough-surfaced rubber pad as a filter member 58 is advantageous in that grooves in the rough surface permit each nozzle opening to be filled by the vacuum pulled, through conduit 60, from under the screen 59. The foregoing causes a complete filling of the nozzle 51. The combination of elevation temperature, mechanical vibration and application of vacuum above as well as beneath the paste within the cartridge/nozzle assembly, tends to extract any entrapped air and cause the paste to settle in the cartridge without forming voids which would subsequently fill with air resulting in the drying of portions of the paste and voids or skips in the deposits.

SOLDER PASTE HANDLING

The solder paste used for dispensing dries slowly such that electronic devices can be easily placed into the solder paste deposits within a one hour time frame after deposition. After about two hours, the surface of the deposited paste becomes noticeably dry, and after 24 hours the deposits are rigid. Thus, a solder paste dispenser remaining idle for about one hour will become clogged and useless as paste dries at the nozzle orifices and on the surface internal to the dispensing cartridge.

FIG. 5 schematically illustrates a technique for preventing the paste from drying and forming a crust layer in accordance with another illustrative embodiment of the invention. A dispensing cartridge 70, with a multi-orifice nozzle 71 attached thereto, contains a volume of solder paste 72 to be dispensed. As already mentioned above, pressurized air is applied to the top portion of the cartridge 70 to force the paste 72 out of the orifices of the nozzle 71.

In order to evenly transmit the applied air pressure to the body of the paste 72, a floating piston 73 is positioned within the cartridge 70 above the paste 72. The piston 73 is preferably tapered and sized to influence self-centering and prevent an air blow through in sections of lower paste viscosity. In accordance with a preferred embodiment of the invention, a liquid 74 is applied around the floating piston 73 and acts as a liquid seal. Moreover, after using the dispensing assembly 70,71 and if the latter would not be operated again within about 15 minutes, the nozzle 71 is preferably lowered into a small dish 76 containing a liquid seal 77 thereby preventing paste in the orifices of the nozzle 71 from drying. Liquids such as commercially available wave soldering oils and/or fluorinated hydrocarbon materials may be used for the liquid seal 74 and the liquid 77 contained in the nozzle dish 76.

DISPENSING VISCOSITY CONTROL

Figure 6:
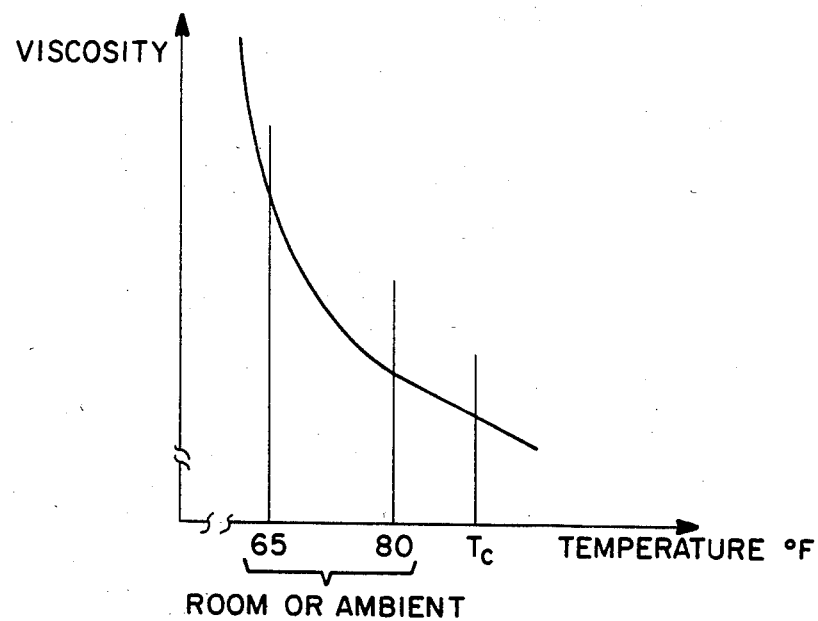
FIG. 6 illustrates the effect of temperature on solder paste viscosity.

As already mentioned above, the temperature of the paste during dispensing is one of the variables affecting the dispensing results. Indeed, most commercial solder pastes exhibit a substantial reduction in viscosity with a relatively small increase in temperature (e.g., between 15° and 20° F.) as illustrated in FIG. 6. According to another embodiment of the invention, consistent dispensing results can be achieved by adequately controlling the viscosity of the paste by monitoring and controlling the paste temperature and maintaining it at a control temperature, $T_c$, above the usual ambient temperature range.

Figure 7:
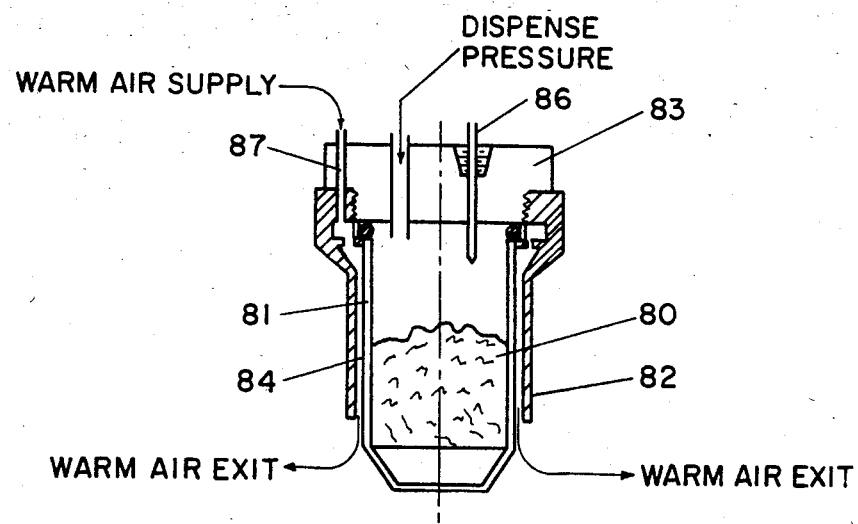
FIG. 7 illustrates a technique for controlling the viscosity of the solder paste according to a still further embodiment of the invention.

FIG. 7 schematically shows an arrangement for controlling the viscosity, and hence the temperature, of the paste 80 within a dispensing cartridge 81. A jacket sleeve 82 is attached to a dispensing assembly support plate 83 and shaped such that a gap 84, formed between the sleeve 82 and the cartridge 81, surrounds the dispensing cartridge 81. A temperature sensitive control device 86 is attached to, and through, the support plate 83 to enable the monitoring of the temperature within the dispensing cartridge 81. A conduit 87, within the plate 83, connects a source of warm fluid (not shown) to the gap 84 between the sleeve 82 and the dispensing cartridge 81. The warm fluid exits the gap 84 at the bottom of the sleeve 82 thereby keeping the paste 80 within a predetermined temperature range in response to the temperature sensitive control device 86. In a preferred embodiment, a low flow of warm air, supplied to the fluid conduit 87, keeps the paste 80 at a desired temperature.

The heating mechanism in FIG. 4, which is symbolically represented by reference numeral 61, may include a sleeve and warming fluid arrangement of the type described in FIG. 7. In particular, a warm air flow around the dispensing cartridge 42 of FIG. 4 would maintain the solder paste within prescribed temperatures during the cartridge loading operation.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method for loading solder paste into a solder dispensing tool having top, bottom and side portions, comprising the steps of:
    placing a supply container of solder paste in transfer relationship with the top portion of the dispensing tool;
    simultaneously applying vacuum through the top and bottom portions of the dispensing tool thereby drawing solder paste out of the supply container into the dispensing tool;
    vibrating the dispensing tool for a first predetermined time period while the vacuum is applied; and
    removing the vacuum while maintaining the vibration of the dispensing tool for a second predetermined time period.

2. A method according to claim 1, wherein the placing step comprises the steps of:
    attaching the supply container to one side of an adaptor plate; and
    coupling the top portion of the dispensing tool to the opposite side of the adaptor plate.

3. A method according to claim 2, comprising the step of transferring solder paste from the supply container to the dispensing tool through at least one hole formed between the one side and the opposite side of the adaptor plate.

4. A method according to claim 3, comprising the step of applying vacuum to the top portion of the dispensing tool through the adaptor plate.

5. A method according to claim 1, further comprising the step of positioning the bottom portion of the dispensing tool in a supporting body of a vibratable table.

6. A method according to claim 1, wherein the first predetermined time period is of the order of 20 seconds and the second predetermined time period is of the order of 10 seconds.

7. A method according to claim 1, further comprising the step of heating the dispensing tool and the solder paste contained therein within a predetermined temperature range.

8. A method for loading solder paste into a solder dispensing tool having top, bottom and side portions, comprising the steps of:
    positioning the bottom portion of the dispensing tool in a supporting body of a vibratory table;
    placing a supply container of solder paste in transfer relationship with the top portion of the dispensing tool;
    applying vacuum to the top portion of the dispensing tool;
    simultaneously applying vacuum to the bottom portion of the dispensing tool through a filtering arrangement included in the supporting body;
    vibrating the dispensing tool for a first predetermined time period while the vacuum is applied; and
    removing the vacuum while maintaining the vibration of the dispensing tool for a second predetermined time period.

9. An apparatus for loading solder paste from a supply container into a multiorifice solder dispensing tool comprising:
    a vibratable table;
    a supporting body attached to the table and adapted to receive a lower portion of the dispensing tool;
    a plate member adapted to be coupled on one side to a top portion of the dispensing tool and on the other side to the supply container;
    first means for applying vacuum to the top portion of the dispensing tool via the plate member; and
    second means for applying vacuum to the lower portion of the dispensing tool, via the supporting body, said means having an opening centrally located within the supporting body and an elongated conduit formed within the supporting body for coupling a source of vacuum to the centrally located opening.

10. An apparatus according to claim 9, comprising filtering means positioned in the opening within the supporting body between the elongated conduit and the lower portion of the dispensing tool.

11. An apparatus according to claim 10, wherein the filtering means comprise:
    a porous member; and
    a rubber pad, supported on one side by the porous member and adapted to slightly contact the orificed lower portion of the dispensing tool on the other side thereof.

12. An apparatus according to claim 9, wherein the plate member comprises a neck portion having at least one through hole between said one and said other side thereof.

13. An apparatus according to claim 9, wherein the first vacuum applying means comprise an elongated chamber formed in the plate member for coupling a source of vacuum to the top portion of the dispensing tool.

* * * * *

UNITED STATES PATENT AND TRADEMARK OFFICE
CERTIFICATE OF CORRECTION

PATENT NO. : 4,597,420

DATED : July 1, 1986

INVENTOR(S) : D. Schoenthaler and T. Wojcik

It is certified that error appears in the above—identified patent and that said Letters Patent is hereby corrected as shown below:

On the title page, under the heading "U. S. Patent Documents", "2,815,621  10/57  Carter" should read --2,815,621  12/57  Carter--; and "3,838,316  10/74  Ripple et al." should read --3,838,716  10/74  Ripple et al.--

In the specification, Column 1, line 30, "printing" should read --printed--; line 38, "then volume" should read --the volume--; line 55, "multiprint" should read --multipoint--. Column 3, line 57, "$T_1$" should read --$t_1$--. Column 4, line 64, "hold 48" should read --hole 48--. Column 5, line 9, "table 54." should read --body 54.--; line 38, "chamber" should read --via chamber--; line 54, "elevation" should read --elevated--.

Signed and Sealed this

Twenty-first Day of October, 1986

[SEAL]

*Attest:*

DONALD J. QUIGG

*Attesting Officer*       *Commissioner of Patents and Trademarks*